(12) United States Patent
Barna et al.

(10) Patent No.: US 7,396,244 B1
(45) Date of Patent: Jul. 8, 2008

(54) APPARATUS FOR EXTRACTING AND INSERTING A DIMM

(75) Inventors: Kyle S. Barna, Poughkeepsie, NY (US); William L. Brodsky, Binghampton, NY (US); Amanda E. E. Mikhail, Rochester, MN (US); John G. Torok, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/843,250

(22) Filed: Aug. 22, 2007

(51) Int. Cl.
*H01R 13/62* (2006.01)

(52) U.S. Cl. .......................... 439/159; 29/759

(58) Field of Classification Search ......... 439/152–160, 439/328, 325, 261, 372, 377, 326, 327; 29/825, 29/832, 842, 729, 739, 740, 758
See application file for complete search history.

(56) References Cited

U.S. PATENT DOCUMENTS 3,853,379 A * 12/1974 Goodman et al. ........... 439/261
5,853,297 A * 12/1998 Moulton et al. ............. 439/327
7,344,402 B2 * 3/2008 Langgood et al. ........... 439/328
2006/0185159 A1 8/2006 Correll et al.
2007/0032114 A1 2/2007 Sanders et al.

* cited by examiner

*Primary Examiner*—Edwin A. León
(74) *Attorney, Agent, or Firm*—Cantor Colburn LLP; Lynn Augspurger

(57) ABSTRACT

An apparatus for extracting and inserting a circuit card into a socket, the apparatus includes a tool device releasably mountable to opposing sides defining the circuit card. The tool device includes a pair of frame members having a friction fit feature for attachment to the opposing side edges defining the circuit card; and a sliding plane translatable between the pair of frame members. Upward translation of the sliding plane relative to the fixed pair of frame members acts to release latches on the connector to extract the circuit card from the connector upon upward translation of the pair of frame members, and downward translation of the sliding plane relative to the fixed pair of frame members acts to transfer a force to the circuit card, thereby inserting the circuit card with the connector. The apparatus further includes a tool guide having two members opposing each other, each member including a plurality of slots, each configured to guide a respective edge of the tool device therethrough for alignment with the connector.

20 Claims, 4 Drawing Sheets

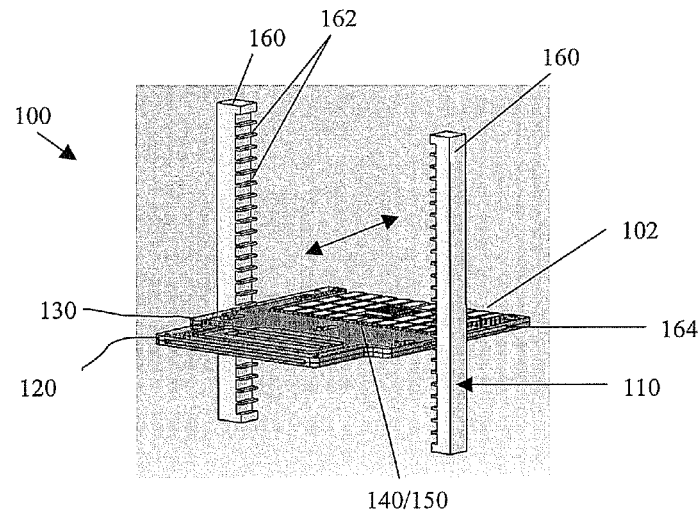
FIG. 3
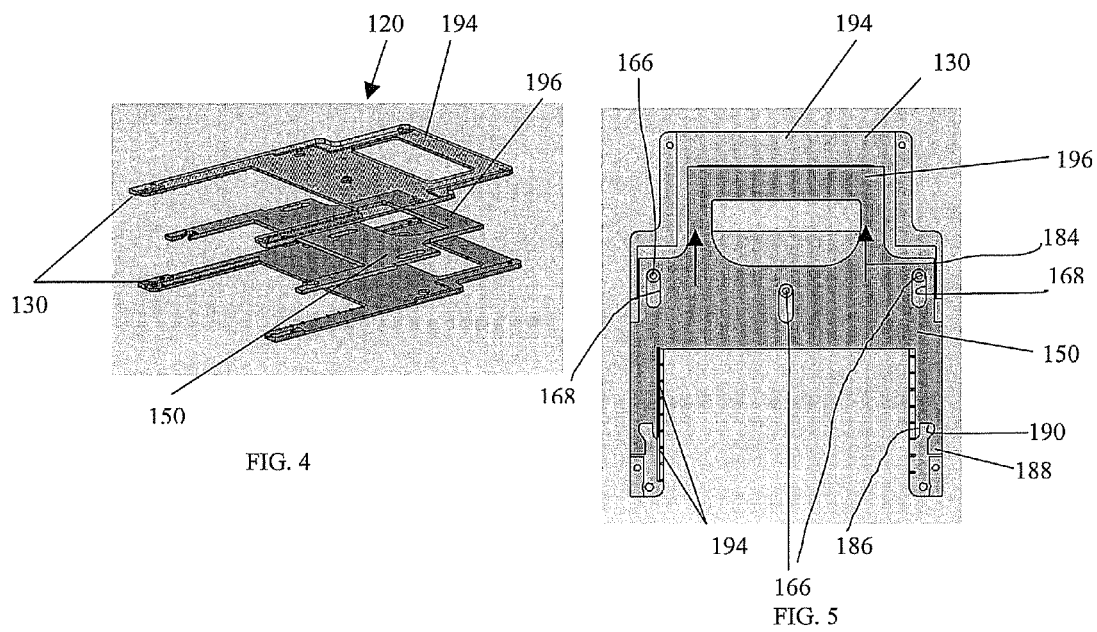
FIG. 4
FIG. 5

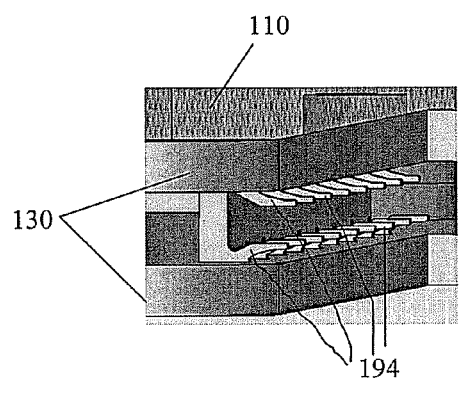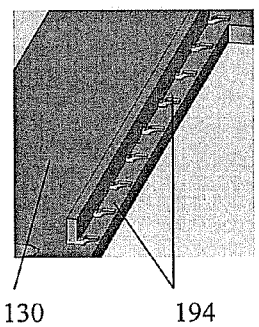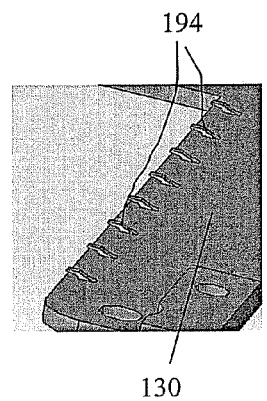
FIG. 9　　　　FIG. 10　　　　FIG. 11
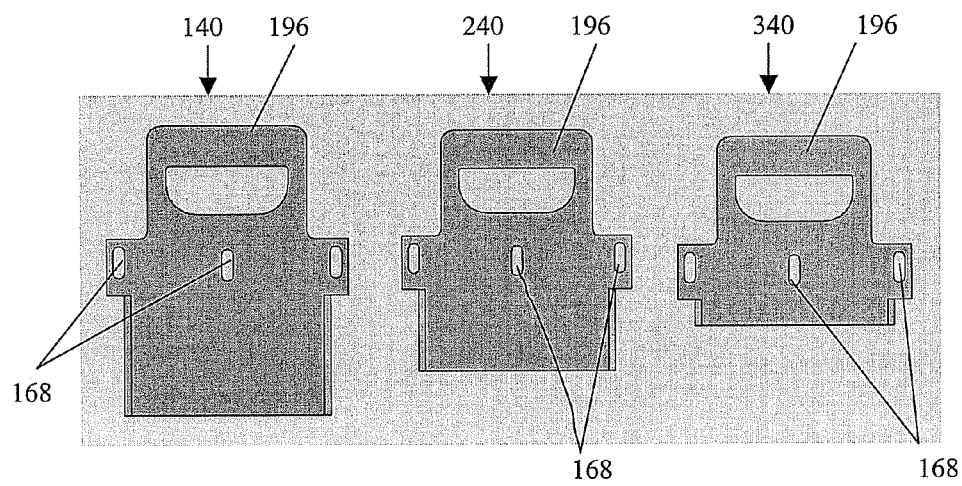
FIG. 12　　　　FIG. 13　　　　FIG. 14

APPARATUS FOR EXTRACTING AND INSERTING A DIMM

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

Field of the Invention

This invention relates to an apparatus for extracting and inserting a card relative to a surface-mount (SMT) connector, and particularly to an apparatus for extracting and inserting a dual in-line memory module (DIMM) a fixed SMT DIMM socket connector.

DESCRIPTION OF BACKGROUND

In computer systems such as personal computers, a socket is referred to as an electrical connector generally mounted on a motherboard (main board) in order to connect extension boards such as extended interface boards for peripheral devices or extended memory boards to the motherboard. The motherboard and extension boards can be electrically connected by plugging the extension boards into the electrical connector.

The structure of a common electrical connector will be described here with the example of an electrical connector used to connect an extension memory module (hereinafter, "module") referred to as a DIMM (dual in-line memory module) as illustrated in FIGS. 1 and 2. This module corresponds to the extension board described above.

A dual in-line memory module (DIMM) is more and more popular for use in the present PC industry, and thus uses a DIMM socket connector mounted on the motherboard for mechanical and electrical interconnect of the corresponding DIMM therein for signal transmission between the motherboard and the DIMM. A main feature of the typical DIMM connector as illustrated in FIGS. 1 and 2 is that the DIMM connector 10 includes generally a pair of latch/eject members 12 disposed at opposite ends of a connector body 14 so that such DIMM may not only be properly retained in the DIMM connector 10 without possibility of inadvertent withdrawal by vibration or external impact, but also easily ejected from the DIMM connector 10 by manual rotational movement of the latch/eject member 12 facilitated by thumb grips 16 disposed on top of the latch/eject member 12.

Conventionally, the modules are inserted into the socket connector by hand. New advances in dual in-line memory modules (DIMM), however, are not as amenable to installation by hand as previous DIMM devices. For example, dynamic random access memory (DRAM) modules, such as double date rate (DDR) modules having 184 interface contact positions, are now being replaced with newer modules (e.g., DDRII modules) having 240 interface contact positions. Due to a larger number of pin contacts in a relatively small area in the newer memory modules, larger insertion forces are generated when installing the memory modules into socket connectors on the motherboard. Furthermore, due to limited space and high force requirements to disengage the DIMM surface-mount (SMT) latches, manual insertion and extraction is difficult and inefficient, and often leads to the possibility of damage to both the DIMM cards and SMT joints. The increased insertion force to engage the memory module, as well as the extraction force to disengage the memory module, to and from the connector, respectively, as well as the high force required to disengage the SMT latches, presents several problems which need to be addressed.

For example, the applied force to overcome the mechanical resistance of the memory modules insertion into the connector on the motherboard tends to flex or bow the motherboard. Particularly with respect to the increasing use of ball grid array (BGA) technology to mount the modules to the motherboard, deflection of the motherboard as the memory modules are installed tends to fracture the BGA connections and compromise the integrity of the electrical connection between the memory modules and the motherboard.

Also, as a user installs such memory modules by hand, and as the user pushes down on the memory modules with a greater force to insert them into the socket connectors, it is difficult to keep the memory module properly aligned with the socket connectors. In particular, unless the insertion force is very carefully applied, the memory module can easily become tilted or angled with respect to the socket connector, which can further frustrate insertion of the memory module into the connector. This may lead the user to apply still more force to the module to attempt to insert the module into the connector, and potentially lead to damage to one or both of the memory module and the connector.

Additionally, the larger insertion forces may introduce discomfort and fatigue to the end users who must install and remove them, either of which can lead to improper or incomplete installation of the memory modules. In turn, this can compromise the performance of the computer system and lead to customer dissatisfaction.

Accordingly, there is a need for a device capable of inserting and extracting a DIMM Memory Card (e.g., single high, double high, quad high) to and from a computer system.

SUMMARY OF THE INVENTION

The shortcomings of the prior art are overcome and additional advantages are provided through the provision of an apparatus for an apparatus for extracting and inserting a circuit card into a socket, the apparatus includes a tool device releasably mountable to opposing sides defining the circuit card. The tool device includes a pair of frame members having a friction fit feature for attachment to the opposing side edges defining the circuit card; and a sliding plane translatable between the pair of frame members. Upward translation of the sliding plane relative to the fixed pair of frame members acts to release latches on the connector to extract the circuit card from the connector upon upward translation of the pair of frame members, and downward translation of the sliding plane relative to the fixed pair of frame members acts to transfer a force to the circuit card, thereby inserting the circuit card with the connector. The apparatus further includes a tool guide having two members opposing each other, each member including a plurality of slots, each configured to guide a respective edge of the tool device therethrough for alignment with the connector.

In another exemplary embodiment, a system includes: a motherboard; a plurality of electrical connectors surface mounted to the motherboard, each electrical connector including a connector body configured to receive and electrically connect an electrical module; a tool device releasably mountable to opposing sides defining the electrical module. The tool device includes a pair of frame members having a friction fit feature for attachment to the opposing sides defining the electrical module; and a sliding plane translatable between the pair of frame members. Upward translation of the sliding plane relative to the fixed pair of frame members acts to release latches on the electrical connector to extract the electrical module from the electrical connector upon upward translation of the pair of frame members, and downward translation of the sliding plane relative to the fixed pair of frame members acts to transfer a force to the electrical module, thereby inserting the electrical module with the electrical connector. The system further includes a tool guide having two members opposing each other, each member including a plurality of slots, each configured to guide a respective edge of the tool device therethrough for alignment with the electrical connector.

Additional features and advantages are realized through the techniques of the present invention. Other embodiments and aspects of the invention are described in detail herein and are considered a part of the invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 3 illustrates a perspective view of a DIMM insertion tool assembly and a DIMM connected thereto for insertion with the DIMM connector surface mounted to the motherboard of FIG. 2 in accordance with an exemplary embodiment of the present invention;

FIG. 4 illustrates an exploded perspective view of an extraction tool device for use with the DIMM insertion tool assembly of FIG. 3 rotated 180 degrees and including a pair of opposing frame members having an extraction plane member therebetween in accordance with an exemplary embodiment of the present invention;

FIG. 5 illustrates a top plan view of the extraction tool device of FIG. 4 showing a top frame member removed therefrom in accordance with an exemplary embodiment of the present invention;

FIG. 9 illustrates a partial perspective view of interlocking friction teeth disposed on the pair of opposing frame members of the extraction tool device of FIG. 5 as a means for containing the DIMM in accordance with an exemplary embodiment of the present invention;

FIGS. 10 and 11 illustrate partial perspective views of the opposing frame members having the interlocking friction teeth disposed thereon for frictional engagement with opposing side edges of the DIMM in accordance with an exemplary embodiment of the present invention; and FIGS. 12-14 illustrate top plan views of various exemplary embodiments of configurations of insertion plane members in accordance with exemplary embodiments of the present invention.

The detailed description explains the preferred embodiments of the invention, together with advantages and features, by way of example with reference to the drawings.

DETAILED DESCRIPTION OF THE INVENTION

Turning now to the drawings in greater detail, the structure of a common electrical connector will be described here with the example of an electrical connector used to connect an extension memory module (hereinafter, "module") referred to as a DIMM (dual in-line memory module). This module corresponds to the extension board described above.

Figure 1:
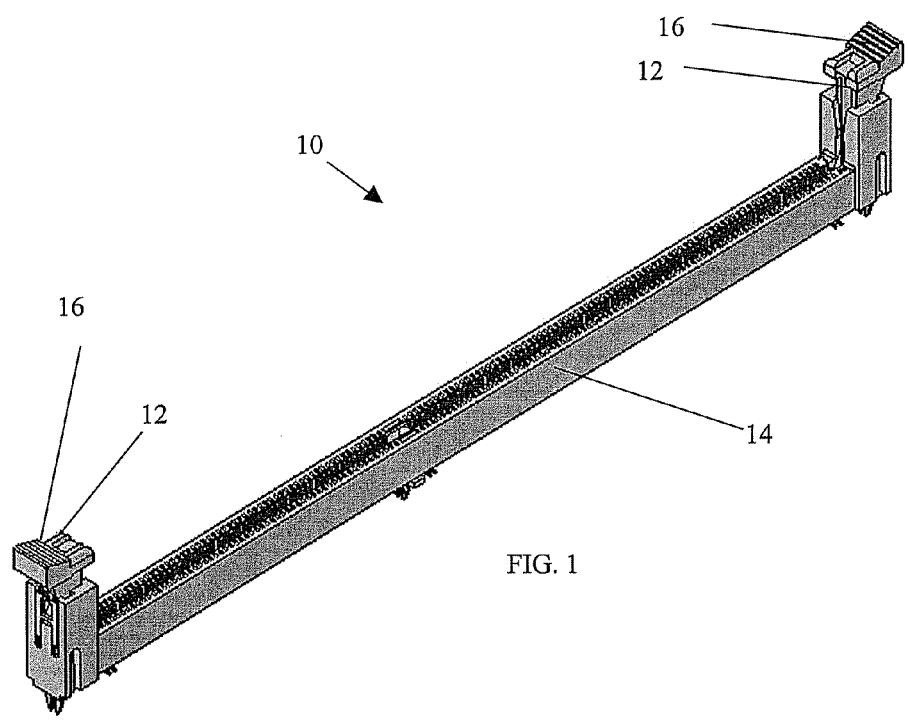
FIG. 1 illustrates a perspective view of a conventional DIMM connector.
Figure 2:
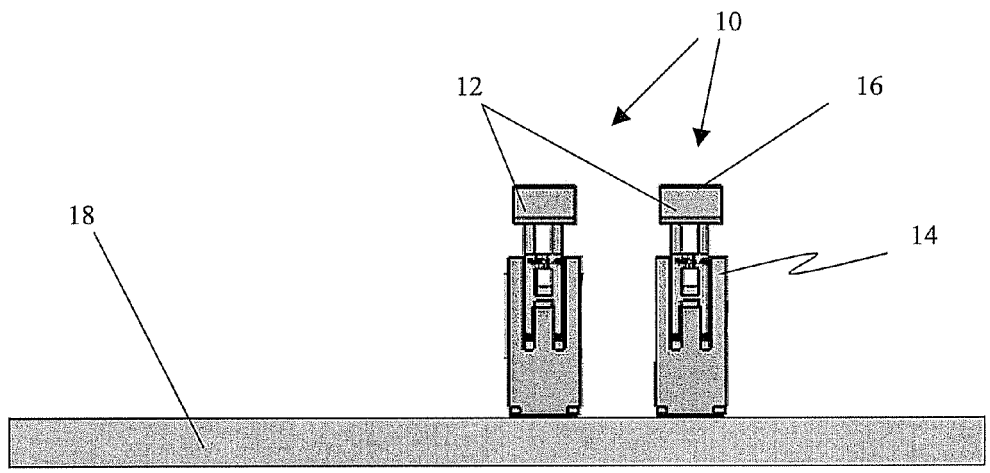
FIG. 2 illustrates an elevation end view of the DIMM connector of FIG. 1 and another DIMM connector surface mounted to a PCB surface of a motherboard (show module 14)
Figure 6:
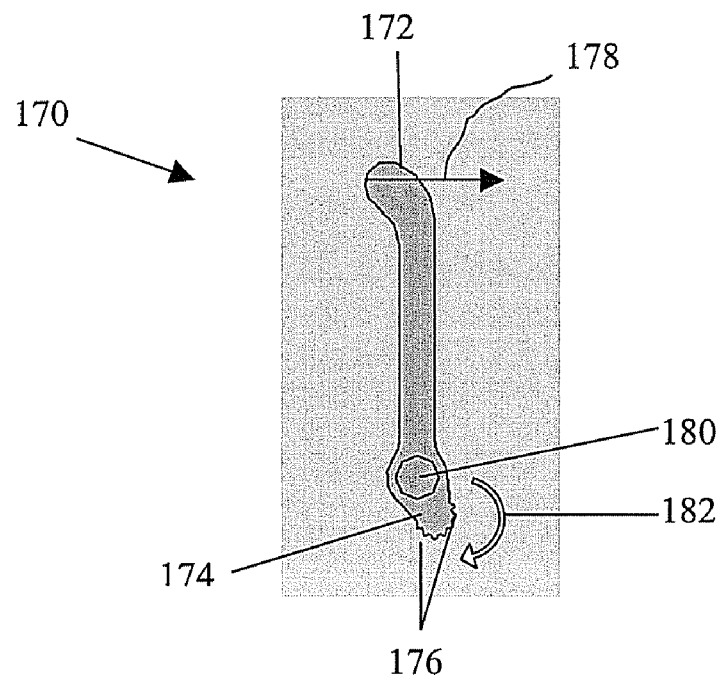
FIG. 6 illustrates a top plan view of an exemplary embodiment of a lever arm for use in the extraction tool device of FIG. 5 in accordance with an exemplary embodiment of the present invention.

Referring to FIGS. 2-4, an exemplary embodiment of a DIMM tool assembly will be described in further detail. FIG. 3 is a perspective view of a DIMM tool assembly 100 and a DIMM 102 connected thereto for insertion with the DIMM connector body 14 surface mounted to the motherboard 18 of FIG. 2 in accordance with an exemplary embodiment of the present invention. The DIMM tool assembly 100 includes a tool guide 110 and an insertion/extraction tool device 120. The insertion/extraction tool device 120 includes a pair of opposing frame members 130 and a sliding plane member 140/150. The sliding plane member is either an insertion plane member 140 (FIG. 10) or an extraction plane member 150, depending on whether the tool device 120 is being used for insertion or extraction of the DIMM 102, respectively.

The tool guide 110 is referred to as a "node comb" guide configured as a slotted guide feature. The tool guide 110 allows for the mobile memory insertion/extraction tool device 120 to be properly aligned with a respective connector body 14. By properly aligning the tool device 120 with a corresponding connector, a greater degree of operator accuracy is obtained and the possibility of accidental slipping which could potentially damage multiple memory cards, joints, surrounding hardware, and the print circuit board (e.g., motherboard 18), is alleviated. The tool guide 110 may be fixed within the system frame (not shown), be mobile and set into or on the system for servicing and removed or even be stored in a free location within the system frame.

While the tool guide 110 is not attached to the actual tool device 120, it serves as an important locating tool in the insertion process of the DIMM 102 with a respective connector body 14. In an exemplary embodiment as illustrated in FIG. 3, the tool guide 110 is configured as a comb-like guide which can be varied along with the extraction/insertion tool device 120 to meet the specifications of the application. For example the tool guide 110 may be made in two pieces, as illustrated in FIG. 3, fixed to a frame or configured as one piece which can be moved.

As illustrated in FIG. 3, the tool guide 110 includes two separate members 160 opposing each other. Each member 160 includes a plurality of slots 162. Each slot 162 is configured to guide a respective edge 164 of the tool device 120 therethrough.

Referring to FIGS. 4 and 5, the extraction plane 150 is a sliding extraction plane which is used in extraction applications of the tool assembly 100. The extraction plane 150 is sandwiched between the two frame members 130 and located using raised circular protrusions 166 (three shown in FIG. 5) extending from at least one of the frame members 130. The extraction plane 150 is configured with guide slots 168 each of which receiving a corresponding raised circular protrusion 166 therethrough, thus defining a path for the extraction plane 150 to slide along. The raised circular protrusions 166 are sites for fasteners (not shown) in which to couple the opposing frame members 130 together once the extraction plane 150 is slidably disposed therebetween.

The sliding of the extraction plane 150 relative to the three protrusions 166 causes a lever arm 170 to rotate, which will be described hereinbelow with reference to FIGS. 5-8. The lever arm 170 is a removable component in the extraction/insertion tool device 120 in which the lever arm 170 disengages the DIMM 102 from its respective connector body 14. The lever arm 170 is defined by a top portion 172 and a lower portion 174. The lower portion 174 includes a gear feature 176 configured to mesh with the thumb grips 16 disposed on top of the latch/eject member 12. In particular referring to FIG. 6, translation of the top portion 172 of the lever arm 170 in a direction indicated by arrow 178 causes the lever arm 170 to rotate about a pivot 180 in a direction indicated by curved arrow 182. As the lower portion having the gear feature 176 configured as a gear-like toe of the lever arm 170 rotates, the gear feature 176 engages the thumb grips 16 disposed on top of the latch/eject member 12 and disengages the respective latch 12.

The gear-like lower portion 174 of the lever arm 170 having this gear feature 176 interfaces with the memory latch 12, which holds the DIMM in place with respect to the connector body 14, and in doing so opens the latch 12 and frees the DIMM for removal. The necessary latch interaction occurs from the rotation of the lever arm 170, which is initiated by translation of the top portion 172 of the lever arm 170 in the direction of arrow 178.

Figures 7, 8:
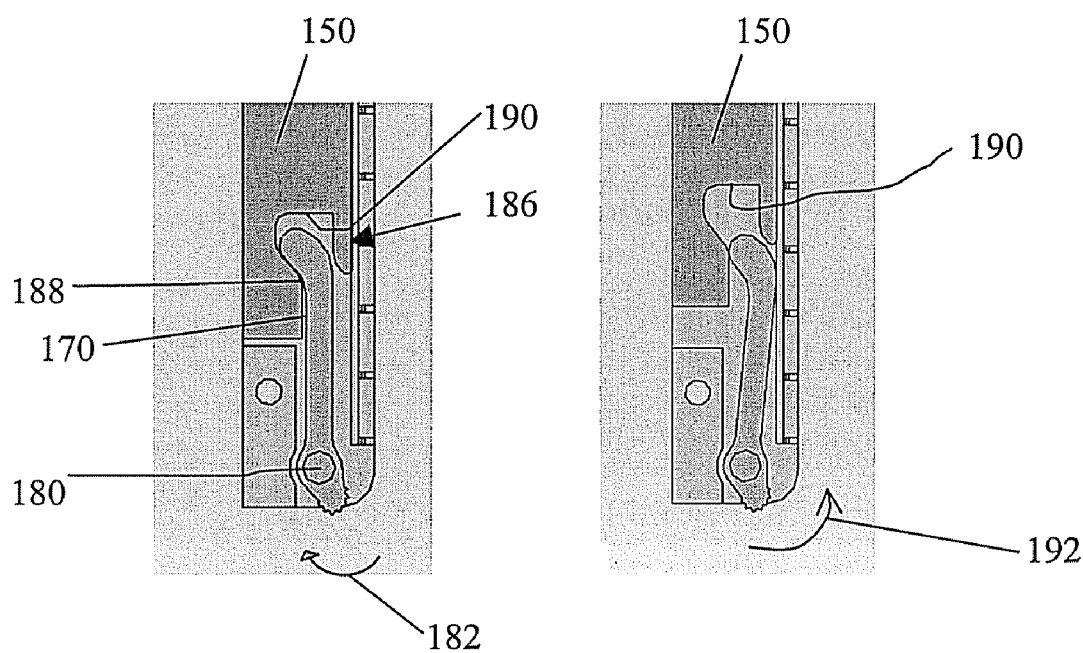
FIG. 7 illustrates a partial top plan view of the extraction tool device of FIG. 4 and lever arm of FIG. 6 installed therewith at an initial starting position in accordance with an exemplary embodiment of the present invention.
FIG. 8 illustrates a partial top plan view of the extraction tool device of FIG. 7 illustrating the lever arm at a final position when the extraction plane is translated upwards in accordance with an exemplary embodiment of the present invention.

Referring to FIGS. 5-8, the lever arm-sliding plane mechanism will be described as the functional part of the insertion/extraction tool device 120. By applying an upward pressure on the extraction plane 150 indicated by arrow 184 in FIG. 5, the top portion 172 of the lever arm 170 is forced inward in the direction of arrow 178 and rotated about pivot 180 in the direction of curved arrow 182. A finger-like feature or resetting finger 186 extends from each side of the extraction plane 150 to allow for a simple resetting of the tool device 120 by wedging the lever arm 170 back into an initial start position, as illustrated in FIG. 7.

More specifically, FIG. 7 illustrates the initial starting position as the extraction plane 150 is lifted up the lever arm 170 pivots in the direction of curved arrow 182. The pivoting of lever arm in the direction of curved arrow 182 is a result of a wider portion 188 of the extraction plane 150 coming into contact with the top portion 172 of the lever arm 170 as the extraction plane is lifted up in the direction of arrow 184. Each outboard side of the extraction plane 150 is defined by an outer wider portion 188 and an inward resetting finger 186 facing the outer wider portion 188. The outer wider portion 188 and an inward resetting finger 186 define a cavity 190 which surrounds the top portion 172 of the lever arm 170.

FIG. 8 illustrates a final position after the extraction plane 150 is lifted up in the direction of arrow 184. When the extraction plane 150 is returned to the initial position of FIG. 7, the resetting finger 186 moves downward causing the pivot arm 170 to rotate in a direction of curved arrow 192.

Referring again to FIGS. 4 and 5, the frame members 130 and extraction plane 150 each have a handle portion 194 and 196, respectively. The respective handle portions 194 and 196 are offset from one another to allow squeezing together in order to bias the extraction plane 150 in direction of arrow 184, as will be recognized by one skilled in the pertinent art.

Referring now to FIGS. 9-11, interlocking friction teeth 194 are used as a means of containing the DIMM 102 within the tool device 120. FIG. 9 illustrates a partial perspective view of interlocking friction teeth 194 disposed on the pair of opposing frame members 130 of the extraction tool device 120 of FIG. 5 as a means for containing the DIMM 102 in accordance with an exemplary embodiment of the present invention. FIGS. 10 and 11 illustrate partial perspective views of the opposing frame members 130 having the interlocking friction teeth 194 disposed thereon for frictional engagement with opposing side edges of the DIMM 102 in accordance with an exemplary embodiment of the present invention. Each frame member 130 has a plurality of the friction teeth 194 arranged along a portion of each opposing inward edge defining an opening in which to receive the DIMM 102. On extraction, the tool device 120 is located to the card and slid around the DIMM 102 and held onto by the interlocking friction teeth 194. As soon as the DIMM 102 is released from the system it is already held, supported and protected by this feature of the tool device 120. This method is particularly useful because it allows for the DIMM 102 to be manually handled as little as possible, and thus, the memory card 102 is protected from being dropped, component damage, etc. The friction teeth 194 are disposed alternately on both sides of the respective frame member 130, and in doing so, when opposing frame members 130 are assembled, each side supporting the memory card 102 has a complete set of interlocking teeth 194, which hold the card in place.

Referring now to FIGS. 12-14, interchangeable sliding insertion planes 140, 240, 340, respectively, are used for the insertion application of the insertion/extraction tool device 120. The insertion planes 140, 240, 340 vary in size to account for the different sizes of memory cards 102 being used. By removing the lever arm 170 and replacing the extraction plane 150 with the correct insertion plane 140, 240, 340, the tool device 120 can become an insertion tool. For example, the memory card 102 is placed in the tool device 120 and the tool device 120 is located relative to a corresponding SMT connector 10. The bottom of the tool frame members 130 move the free latches 12 outward, and by applying force to the insertion plane 140, 240, 340 via handle 196 relative to the fixed frame members 130, the memory card 102 is put in place and is locked when the insertion plane 140, 240, 340 stops. At this point, the latches 12 may be locked onto memory card 102. The insertion planes 140, 240, 340 are each configured with guide slots 168 to receive a corresponding circular protrusion 166 extending from one of the frame members 130.

FIGS. 12-14 show three different sizes of the interchangeable insertion planes 140, 240, 340. By fitting one of them in the same spot as the extraction plane 150 and removal of the lever arm 170, the side edges of the memory card plane fit inside the interlocking teeth 194 on each frame member 130 and the bottom edge of the insertion plane 140, 240, 340 rests on top the memory card to transfer force during plugging.

In exemplary embodiments, the tool frame members 130 are created so that each part of the frame 130 is the same. By having an asymmetric design, upon mating of the two frame members 130, the sides the tool device 120 becomes symmetric and may also have more intricate design features (e.g., interlocking friction teeth 194).

In sum, by removing the lever arm 170 and replacing the extraction plane 150 with an appropriate insertion plane 140, 240, 340, the tool device 120 can be assembled as an insertion tool. This is accomplished by placing the desired DIMM 102 into the tool device 120, locating the tool device 120 using the node combs 110 built into the node frame (or temporarily disposed thereat), and engaging the tool device 120 by applying pressure to the insertion plane 140, 240, 340. The DIMM 102 can then be locked in place by rotating the latches into a locked position which allows the interlocking friction teeth 194 of the tool device 120 to be pulled from the DIMM 102.

Once the memory card 102 is inserted into the socket 10, the insertion tool device 120 may be disengaged or removed from the memory card 102. Alternatively, the insertion tool device 120 may remain coupled to the memory card 102 for future use. The same is true for the tool guide 110, as discussed above.

From the above described exemplary embodiments, the following attributes of the present invention are disclosed. The invention relates to the creation of an apparatus capable of extracting and inserting a DIMM memory card (e.g., single high, double high, or quad high) from a computer system. The apparatus impacts the simple, safe plugging and unplugging of the DIMM memory card without damage to the DIMM or surrounding hardware.

In particular, the present disclosure describes an apparatus capable of releasing DIMM SMT latches. By releasing the DIMM SMT latches, the DIMM memory card is released from the SMT connector and supported by the tool frame of the apparatus for removal from the system. This is accomplished by a squeezing action between a top handle portion of the tool frame and a handle portion of the sliding extraction plane, which is in operable communication with a lever arm causing the lever arm to rotate. Rotation of the lever arm, which is in operable communication with a corresponding SMT latch in turn, disengages the SMT latches.

Replacing and removing features of the apparatus allows it to be converted into an insertion tool. In this insertion application, the DIMM memory card is held within the tool frame and upon location of the SMT joint, with or without the aid of a guide feature of the apparatus, can be engaged in the system.

The apparatus described in the above exemplary embodiments accurately locates, disengages and supports the DIMM memory card, or other similar expensive hardware, upon insertion and extraction, as well as locates and engages an SMT connector and latches thereof upon insertion of the tool frame, thus eliminating problems associated with the plugging and unplugging of this expensive hardware. In addition to making insertion and extraction of the DIMM memory card more efficient, the present invention provides for a more ergonomic apparatus for operators.

While the preferred embodiments to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An apparatus for extracting and inserting a circuit card into a socket, the apparatus comprising:
    a tool device releasably mountable to opposing sides defining the circuit card, the tool device including;
        a pair of frame members having a friction fit feature for attachment to the opposing side edges defining the circuit card; and
        a sliding plane translatable between the pair of frame members,
            wherein upward translation of the sliding plane relative to the fixed pair of frame members acts to release latches on the connector to extract the circuit card from the connector upon upward translation of the pair of frame members, and downward translation of the sliding plane relative to the fixed pair of frame members acts to transfer a force to the circuit card, thereby inserting the circuit card with the connector; and
    a tool guide having two members opposing each other, each member including a plurality of slots, each configured to guide a respective edge of the tool device therethrough for alignment with the connector.

2. The apparatus of claim 1, wherein the connector is a dual in-line memory module (DIMM) connector body and the circuit card is a DIMM.

3. The apparatus of claim 1, wherein the sliding plane is an insertion plane exchangeable with the extraction plane for insertion of the circuit card with the connector.

4. The apparatus of claim 1, wherein the sliding plane includes a plurality of guide slots having respective circular protrusions extending therethrough and fixedly extending from one of the pair of frame members, the guide slots limiting translation of the sliding plane relative to the frame members.

5. The apparatus of claim 1, wherein the tool device further includes a pair of lever arms when the sliding plane is an extraction plane, each lever arm having a lower portion and a top portion, the lower portion is releasably and pivotally mounted to one of the pair of frame members and the top portion is engagable with the extraction plane.

6. The apparatus of claim 5, wherein the lower portion of the lever arm includes a gear feature engagable with a thumb grip on the latches of the connector.

7. The apparatus of claim 6, wherein the upward translation of the sliding plane relative to the fixed pair of frame members acts to rotate the lever arm and cause the gear feature to release the latches.

8. The apparatus of claim 7, wherein the extraction plane is configured as a substantially planar member having two opposing legs extending therefrom defining a cutout to receive the circuit card therein, an end portion of each of the legs defining a cavity to receive the top portion of a respective lever arm.

9. The apparatus of claim 8, wherein the cavity is defined by an outer wide portion and an inward resetting finger both engagable with the lever arm, the resetting finger rotates the lever arm to an initial position, and the wide portion rotates the lever to a final position opposite to the initial position.

10. The apparatus of claim 8, wherein the friction fit feature includes a plurality of interlocking friction teeth disposed on each of the legs defining each frame member.

11. A system comprising:
    a motherboard;
    a plurality of electrical connectors surface mounted to the motherboard, each electrical connector including a connector body configured to receive and electrically connect an electrical module;
    a tool device releasably mountable to opposing sides defining the electrical module, the tool device including;
        a pair of frame members having a friction fit feature for attachment to the opposing sides defining the electrical module; and
        a sliding plane translatable between the pair of frame members,
            wherein upward translation of the sliding plane relative to the fixed pair of frame members acts to release latches on the electrical connector to extract the electrical module from the electrical connector upon upward translation of the pair of frame members, and downward translation of the sliding plane relative to the fixed pair of frame members acts to transfer a force to the electrical module, thereby inserting the electrical module with the electrical connector; and a tool guide having two members opposing each other, each member including a plurality of slots, each configured to guide a respective edge of the tool device therethrough for alignment with the electrical connector.

12. The apparatus of claim 11, wherein the electrical connector is a dual in-line memory module (DIMM) connector body and the electrical module is a DIMM.

13. The apparatus of claim 11, wherein the sliding plane is an insertion plane exchangeable with the extraction plane for insertion of the circuit card with the connector.

14. The apparatus of claim 11, wherein the sliding plane includes a plurality of guide slots having respective circular protrusions extending therethrough and fixedly extending from one of the pair of frame members, the guide slots limiting translation of the sliding plane relative to the frame members.

15. The apparatus of claim 11, wherein the tool device further includes a pair of lever arms when the sliding plane is an extraction plane, each lever arm having a lower portion and a top portion, the lower portion is releasably and pivotally mounted to one of the pair of frame members and the top portion is engagable with the extraction plane.

16. The apparatus of claim 15, wherein the lower portion of the lever arm includes a gear feature engagable with a thumb grip on the latches of the electrical connector.

17. The apparatus of claim 16, wherein the upward translation of the sliding plane relative to the fixed pair of frame members acts to rotate the lever arm and cause the gear feature to release the latches.

18. The apparatus of claim 17, wherein the extraction plane is configured as a substantially planar member having two opposing legs extending therefrom defining a cutout to receive the electrical module therein, an end portion of each of the legs defining a cavity to receive the top portion of a respective lever arm.

19. The apparatus of claim 18, wherein the cavity is defined by an outer wide portion and an inward resetting finger both engagable with the lever arm, the resetting finger rotates the lever arm to an initial position, and the wide portion rotates the lever to a final position opposite to the initial position.

20. The apparatus of claim 18, wherein the friction fit feature includes a plurality of interlocking friction teeth disposed on each of the legs defining each frame member.

* * * * *